United States Patent
Kim et al.

(10) Patent No.: US 7,101,769 B2
(45) Date of Patent: Sep. 5, 2006

(54) METHOD OF FORMING A RELIABLE HIGH PERFORMANCE CAPACITOR USING AN ISOTROPIC ETCHING PROCESS

(75) Inventors: Seung-Beom Kim, Gyeonggi-do (KR); Won-Mo Park, Gyeonggi-do (KR); Yun-Jae Lee, Seoul (KR); Joon-Mo Kwon, Gyeonggi-do (KR); Myoung-Hee Han, Gyeonggi-do (KR); Man-Jong Yu, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 171 days.

(21) Appl. No.: 10/776,546

(22) Filed: Feb. 10, 2004

(65) Prior Publication Data
US 2004/0159909 A1 Aug. 19, 2004

(30) Foreign Application Priority Data
Feb. 11, 2003 (KR) ...................... 10-2003-0008631

(51) Int. Cl.
*H01L 21/20* (2006.01)
(52) U.S. Cl. ...................... 438/398; 438/740
(58) Field of Classification Search ................ 438/255, 438/398, 253, 254, 396, 397, 240, 738, 739, 438/740
See application file for complete search history.

(56) References Cited

U.S. PATENT DOCUMENTS

| | | | |
|---|---|---|---|
| 6,459,112 B1 | 10/2002 | Tsuboi et al. | |
| 6,548,853 B1* | 4/2003 | Hwang et al. | 257/306 |
| 6,583,056 B1* | 6/2003 | Yu et al. | 438/639 |
| 6,911,364 B1* | 6/2005 | Oh et al. | 438/253 |

* cited by examiner

*Primary Examiner*—Tuan H. Nguyen
(74) *Attorney, Agent, or Firm*—Marger Johnson & McCollom, P.C.

(57) ABSTRACT

Disclosed herein is a method of forming a reliable high performance capacitor using an isotropic etching process to optimize the surface area of the lower electrodes while preventing an electrical bridge from forming between the lower electrodes. This method includes multiple sacrificial oxide layers that are formed over a substrate, an insulating layer with contact plugs, and an etch stopping layer. The sacrificial oxide layers are patterned and additionally isotropically etched to form an expanded capacitor hole. An exposed portion of the etch stopping layer is then etched to form a final capacitor hole exposing an upper portion of the contact plug and a portion of the insulating layer adjacent thereto. The semiconductor substrate having the final capacitor hole is cleaned to remove a native oxide film on the exposed upper portion of the contact plug.

15 Claims, 7 Drawing Sheets

METHOD OF FORMING A RELIABLE HIGH PERFORMANCE CAPACITOR USING AN ISOTROPIC ETCHING PROCESS

This U.S. non-provisional patent application claims priority under 35 U.S.C. § 119 of Korean Patent Application No. 2003-0008631 filed on Feb. 11, 2003, the contents of which are hereby incorporated in their entirety by reference.

BACKGROUND OF INVENTION

1. Field of the Invention

This disclosure relates to a method of manufacturing a semiconductor device, and more particularly to a method of forming a reliable high performance capacitor using an isotropic etching process.

2. Description of Related Art

Memory devices such as DRAM devices require a high performance cell capacitor with sufficient capacitance in order to increase both its refresh period and its tolerance to alpha particles. However, to implement this high performance cell capacitor, it is necessary to either increase the area between an upper electrode (plate electrode) and a lower electrode (storage node electrode) that overlaps, or reduce the thickness of a dielectric film interposed between the upper and lower electrodes. In addition, this second option requires that the dielectric film between the electrodes be made of a material having a high dielectric constant.

Recently, a method of increasing the height of the storage node electrode has been widely used in order to implement this desired high performance capacitor. In this method, a surface area of the storage node electrode is increased, whereby the capacitance of the capacitor is increased.

This method of forming the cell capacitor is taught in U.S. Pat. No. 6,459,112 to Tsuboi et al. entitled "Semiconductor device and process for fabricating the same." FIGS. 1A through 1C are cross-sectional views illustrating a method of forming a capacitor as disclosed in U.S. Pat. No. 6,459,112.

Referring to FIG. 1A, an insulating layer 20 is formed on a semiconductor substrate 10. The insulating layer 20 is patterned, using a photolithography technique and an etching technique, to form node contact holes which expose predetermined regions of the semiconductor substrate 10. The node contact holes are filled with a conductive material to form contact plugs 25.

Referring to FIG. 1B, an etch stopping layer 30 and a sacrificial oxide layer 40 are sequentially formed over the surface of the semiconductor substrate having the contact plugs 25. The sacrificial oxide layer 40 is patterned to form capacitor holes exposing predetermined regions of the etch stopping layer 30. The exposed portion of the etch stopping layer 30 is then dry-etched to form final capacitor holes which expose the top surfaces of the contact plugs 25 and neighboring portions of the insulating layer 20 around the top surface of the contact plugs 25. Here, the etch stopping layer 30 is over-etched, so that the exposed portions of the contact plugs 25 and the neighboring portions of the insulating layer 20 are etched by a predetermined depth.

An oxide layer cleaning process is performed using a hydrofluoric acid as a cleaning solution to isotropically etch a portion of the insulating layer 20 under the etch stopping layer 30 and the sacrificial oxide layer 40, thereby forming cleaned capacitor holes 45.

Referring to FIG. 1C, a polysilicon layer is formed over the entire surface of the semiconductor substrate having the cleaned capacitor holes 45. A portion of the polysilicon layer above the sacrificial oxide layer 40 is selectively removed, and then the sacrificial oxide layer 40 is selectively removed, thereby forming lower electrodes 50 of the capacitor.

According to U.S. Pat. No. 6,459,112, polymers and native oxide films in the final capacitor holes are removed by a single step of cleaning process before forming the polysilicon layer in the cleaned capacitor holes 45. Therefore, a lengthy cleaning process is required in order to maximize the diameters of the cleaned capacitor holes 45. Such a long cleaning process time may lead to the formation of through holes in the portion of the insulating layer 20 between the final capacitor holes. This, in turn, causes a problem where the lower electrodes are electrically connected to each other.

However, if the cleaning process is performed in a shorter time interval to prevent the through hole from being formed, it is difficult to maximize the diameters of the final capacitor holes. Consequently, it is difficult to optimize the cleaning process.

SUMMARY OF THE INVENTION

It is a feature of this disclosure to provide a method of forming a capacitor that can optimize a surface area of lower electrodes thereof and can prevent an electrical bridge between the lower electrodes.

In accordance with embodiments of the invention, a method of forming a reliable high performance capacitor is provided. The method includes forming an insulating layer over a semiconductor substrate, forming a contact plug to penetrate the insulating layer, and sequentially forming an etch stopping layer, a lower sacrificial oxide layer, and an upper sacrificial oxide layer over a surface of the semiconductor substrate and the contact plug. The method further includes patterning the lower and upper sacrificial oxide layers to form a capacitor hole exposing a portion of the etch stopping layer over the contact plug, isotropically etching the lower sacrificial oxide layer to form an expanded capacitor hole, and then etching the exposed portion of the etch stopping layer to form a final capacitor hole exposing an upper portion of the contact plug and a neighboring portion of the insulating layer adjacent thereto. Finally, the semiconductor substrate having the final capacitor hole is cleaned to remove a native oxide film formed on the exposed upper portion of the contact plug, and a lower electrode, a dielectric layer, and an upper electrode are sequentially formed over the semiconductor substrate having the cleaned capacitor hole.

BRIEF DESCRIPTION OF THE DRAWINGS

The above objects and advantages of the present invention will become more apparent by describing in detail a embodiments of the present invention with reference to the attached drawings, in which.

DETAILED DESCRIPTION

Figure 1A:
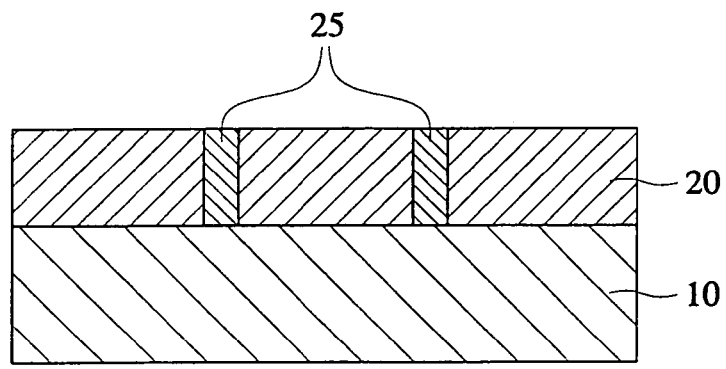
FIGS. 1A through 1C are cross-sectional diagrams illustrating a process of forming a cylinder type capacitor as disclosed in U.S. Pat. No. 6,459,112.
Figure 1B:
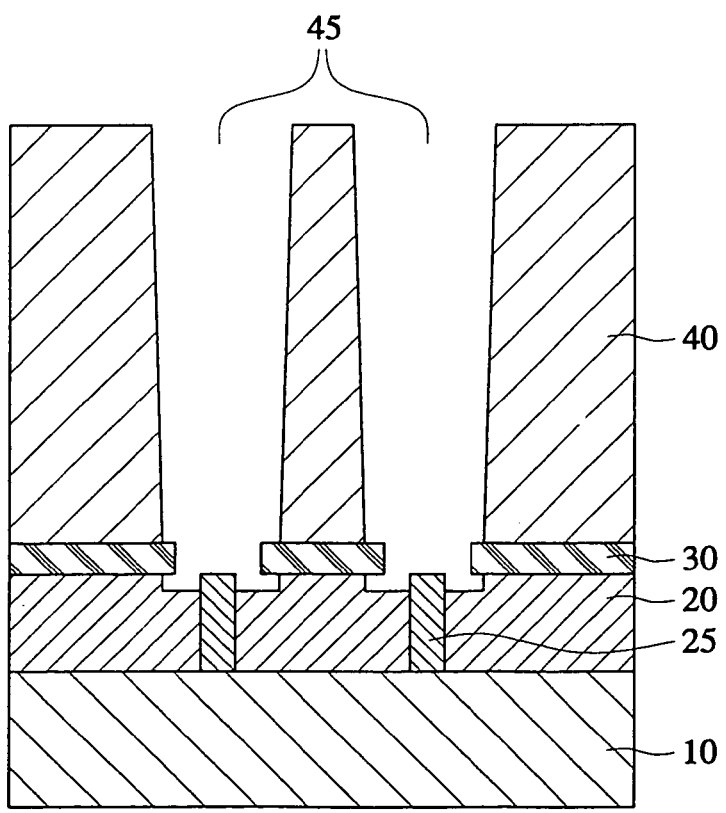
Figure 1C:
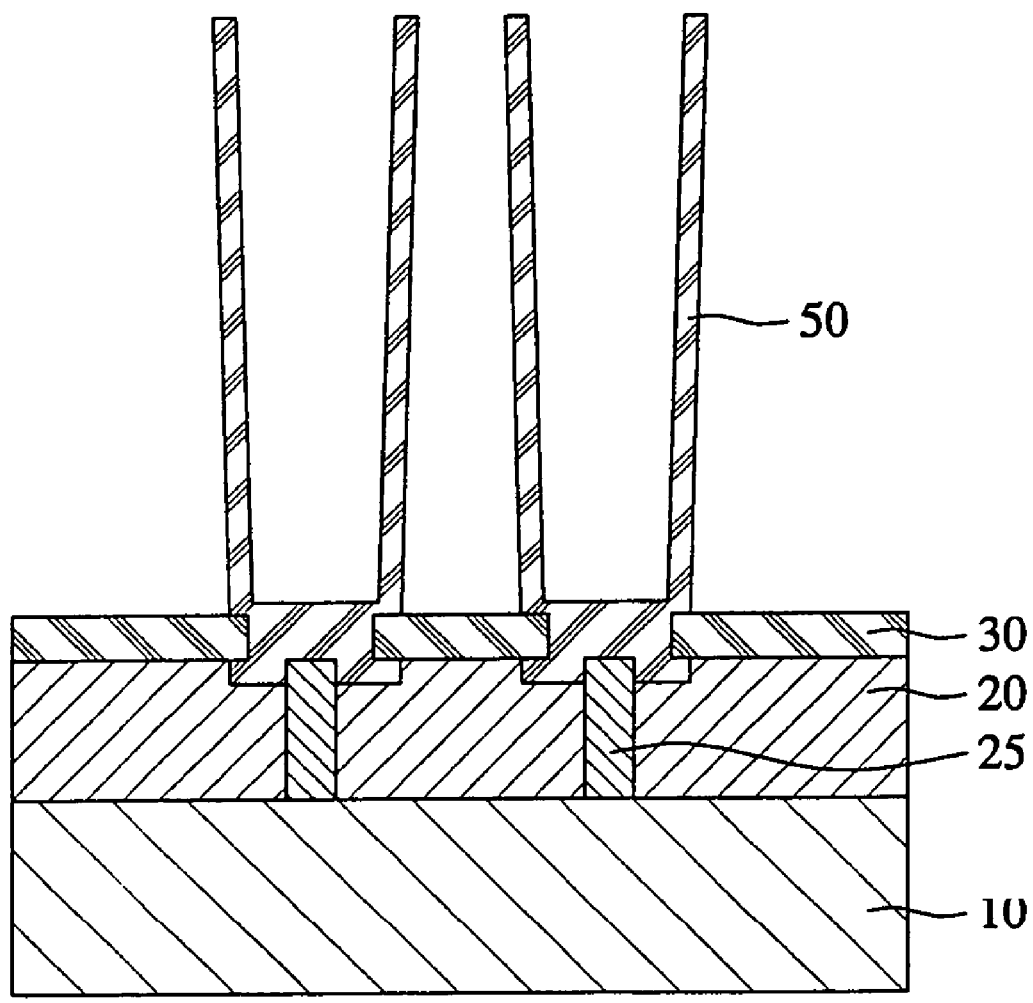

The present invention will now be described more fully with reference to the accompanying drawings, in which embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art. In the drawings, the shape of elements is exaggerated for clarity, and the same reference numerals in different drawings represent the same element.

FIGS. 2A through 2G are cross-sectional views illustrating a process of forming a reliable high performance capacitor using an isotrophic etching technique according to an embodiment of the invention.

Figure 2A:
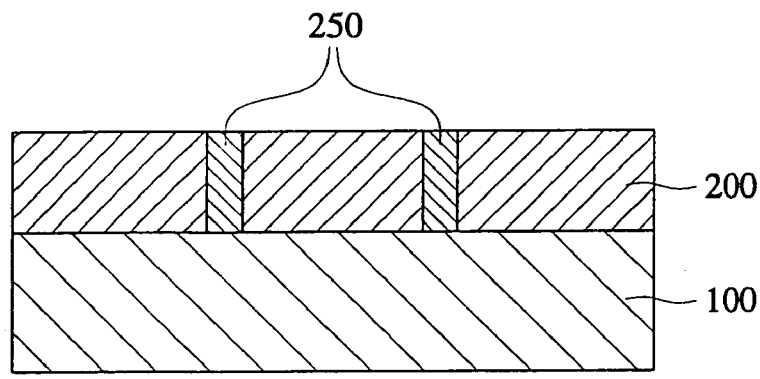
FIGS. 2A through 2G are cross-sectional diagrams illustrating a process of forming a reliable high performance capacitor using an isotrophic etching technique according to an embodiment of the invention.

Referring to FIG. 2A, an insulating layer 200 made of a material such as an oxide is formed on a semiconductor substrate 100. The insulating layer 200 is patterned using a photolithography technique and an etching technique to form node contact holes which expose predetermined regions of the semiconductor substrate 100. The node contact holes are filled with a conductive material to form contact plugs 250.

Figure 2B:
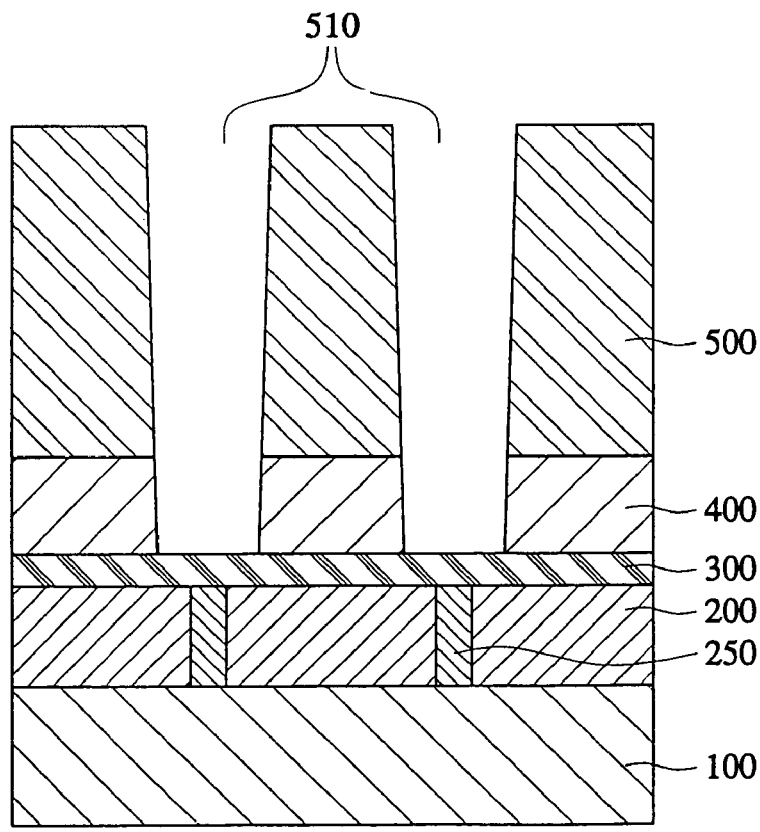

Referring to FIG. 2B, an etch stopping layer 300, a lower sacrificial oxide layer 400, and an upper sacrificial oxide layer 500 are sequentially formed over a surface of the semiconductor substrate 100 and the contact plugs 250. Preferably, the etch stopping layer 300 is made of nitride, and the lower sacrificial oxide layer 400 may be formed from one of the group consisting of borophosphorsilicate glass (BPSG), phosphorsilicate glass (PSG), or undoped silicate glass (USG). The upper sacrificial oxide layer 500 may be formed of an oxide having an etching rate slower than that of the material of the lower sacrificial oxide layer 400, preferably a plasma enhanced tetra-ethyl-ortho-silicate (PE-TEOS).

The lower and upper sacrificial oxide layers 400 and 500 are next patterned using a photolithography technique and an etching technique to form capacitor holes 510 that expose predetermined regions of the etch stopping layer 300.

However, the present invention is not limited to these materials described right above. Rather, one skilled in the art will appreciate that other suitable insulating materials can be used as the etch stopping layer 300, the lower sacrificial oxide layer 400, and the upper sacrificial oxide layer.

Figure 2C:
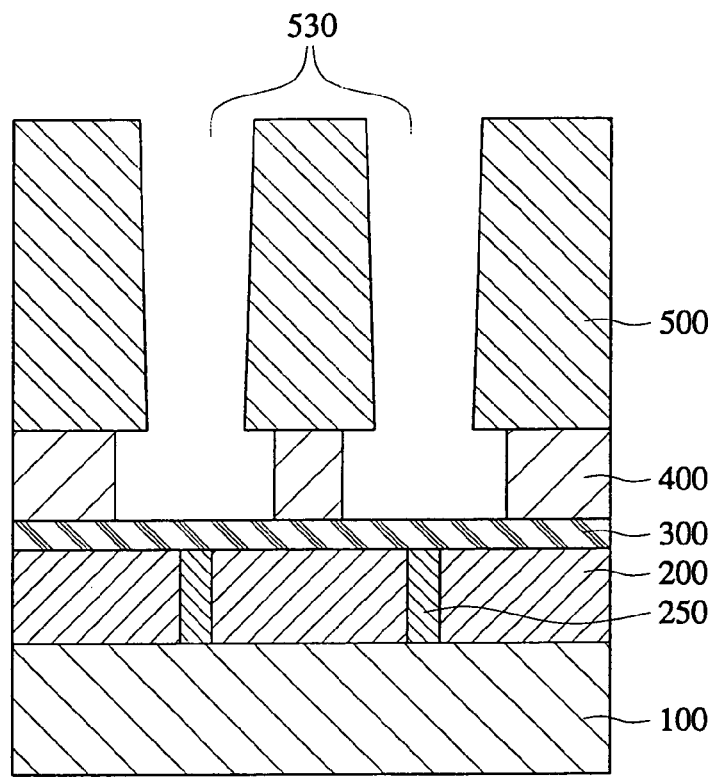

Referring to FIG. 2C, the lower and upper oxide layers 400 and 500 are further isotropically etched using a wet-etching process, which is preferably performed using hydrofluoric acid. As a result, the exposed portions of inside walls of the lower sacrificial oxide layer 400 are recessed to thereby form expanded capacitor holes 530.

Figure 2D:
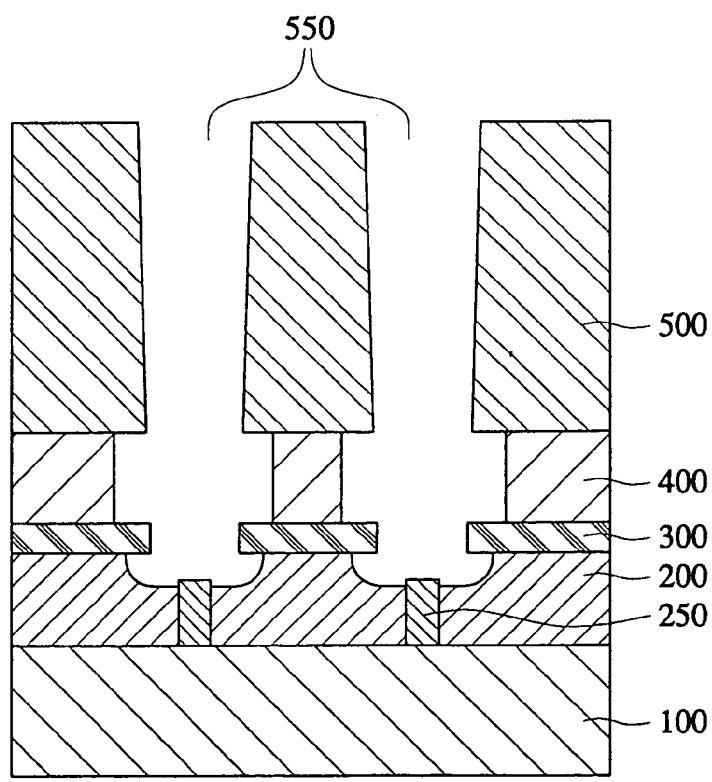

Referring to FIG. 2D, exposed portions of the etch stopping layer 300 are etched using the upper sacrificial oxide layer 500 as an etching mask to form final capacitor holes exposing the top surfaces of the contact plugs 250 and neighboring portions of the insulating layer 200 around the contact plugs 250. Here, the etching process continues past the etch stopping layer 300, i.e. over-etched, so that the contact plugs 250 and the neighboring portions of the insulating layer 200 are also etched by a predetermined depth.

The semiconductor substrate 100 having the final capacitor holes is cleaned using an oxide layer cleaning solution to remove native oxide films on the contact plugs 250. As a result, recessed portions of the inside walls of the lower sacrificial oxide layer 400 are recessed more, and exposed portions of the insulating layer 200 are isotropically etched, thereby forming cleaned capacitor holes 550.

The cleaning process in this embodiment is performed only to remove the native oxide films formed on surfaces of the contact plugs 250, and hence its cleaning process time can be reduced, thereby preventing a through hole from being formed in a portion of the insulating layer 200 between the cleaned neighboring capacitor holes 550.

Consequently, according to an embodiment of the present invention, because the expanded capacitor holes 530 (FIG. 2C) can be formed before the plugs 250 are exposed, a lengthy cleaning process required in the prior art to maximize the diameters of cleaned capacitor holes can be avoided. Thus, the prior art problem where lower electrodes are electrically connected to each other can be prevented.

Figure 2E:
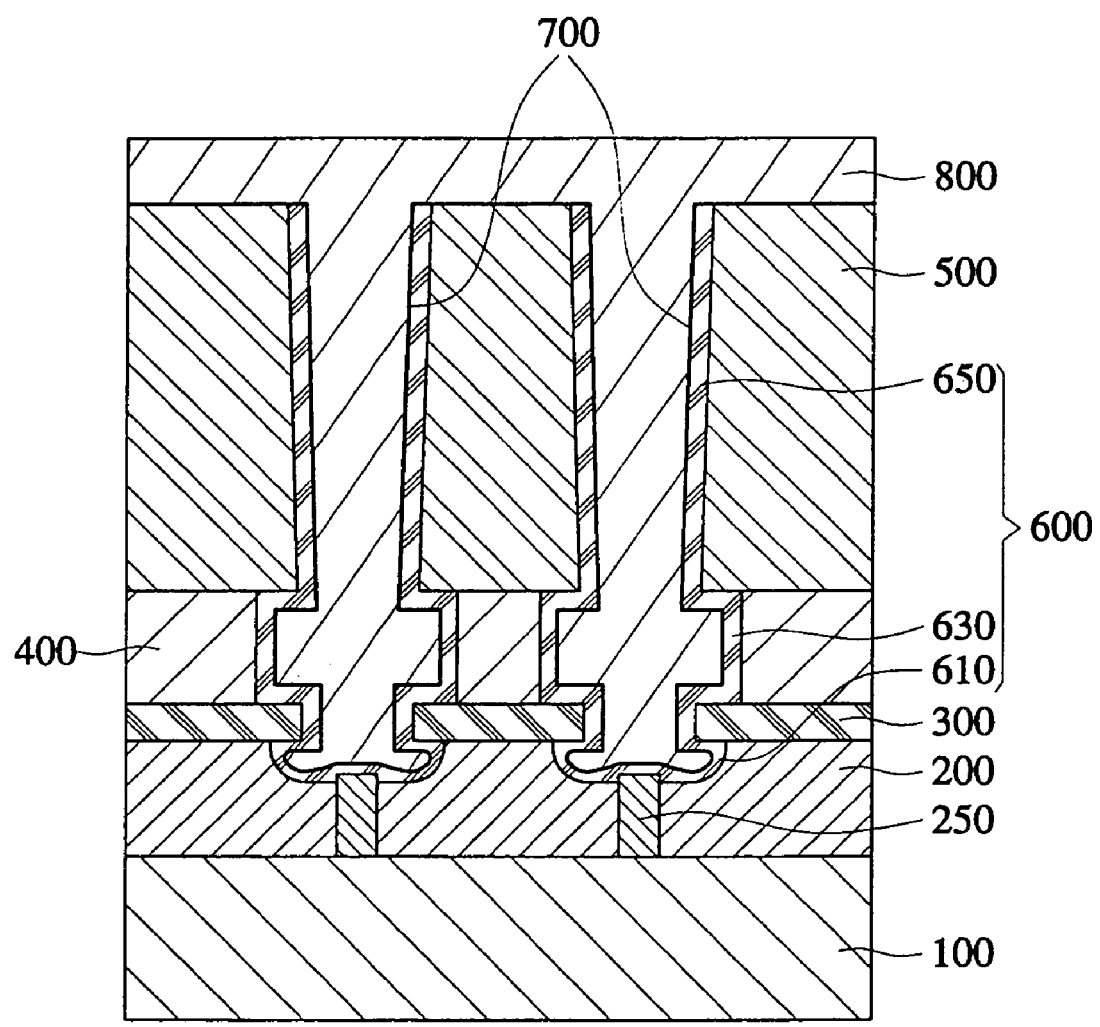

Referring to FIG. 2E, a conformal conductive layer is formed over the surface of the semiconductor substrate 100 having the cleaned capacitor holes 550. The conductive layer is preferably made of polysilicon. A portion of the conductive layer over an upper surface of the upper sacrificial oxide layer 500 is selectively removed to form cylinder type lower electrodes 600 in the cleaned capacitor holes 550. Each of the lower electrodes 600 has a base portion 610 formed below the etch stopping layer 300, an intermediate pole 630 covering a side wall of a hole penetrating the lower sacrificial oxide layer 400, and a top pole 650 covering a side wall of a hole penetrating the upper sacrificial oxide layer 500. The upper portion of the intermediate pole 630 is greater in diameter than a lower portion of the top pole 650. Hence, as shown in FIG. 2E, a step portion of the electrode exists between the intermediate pole 630 and the top pole 650. A dielectric layer 700, and an upper electrode 800 are sequentially formed over the semiconductor substrate 100 having the lower electrodes 600.

Figure 2F:
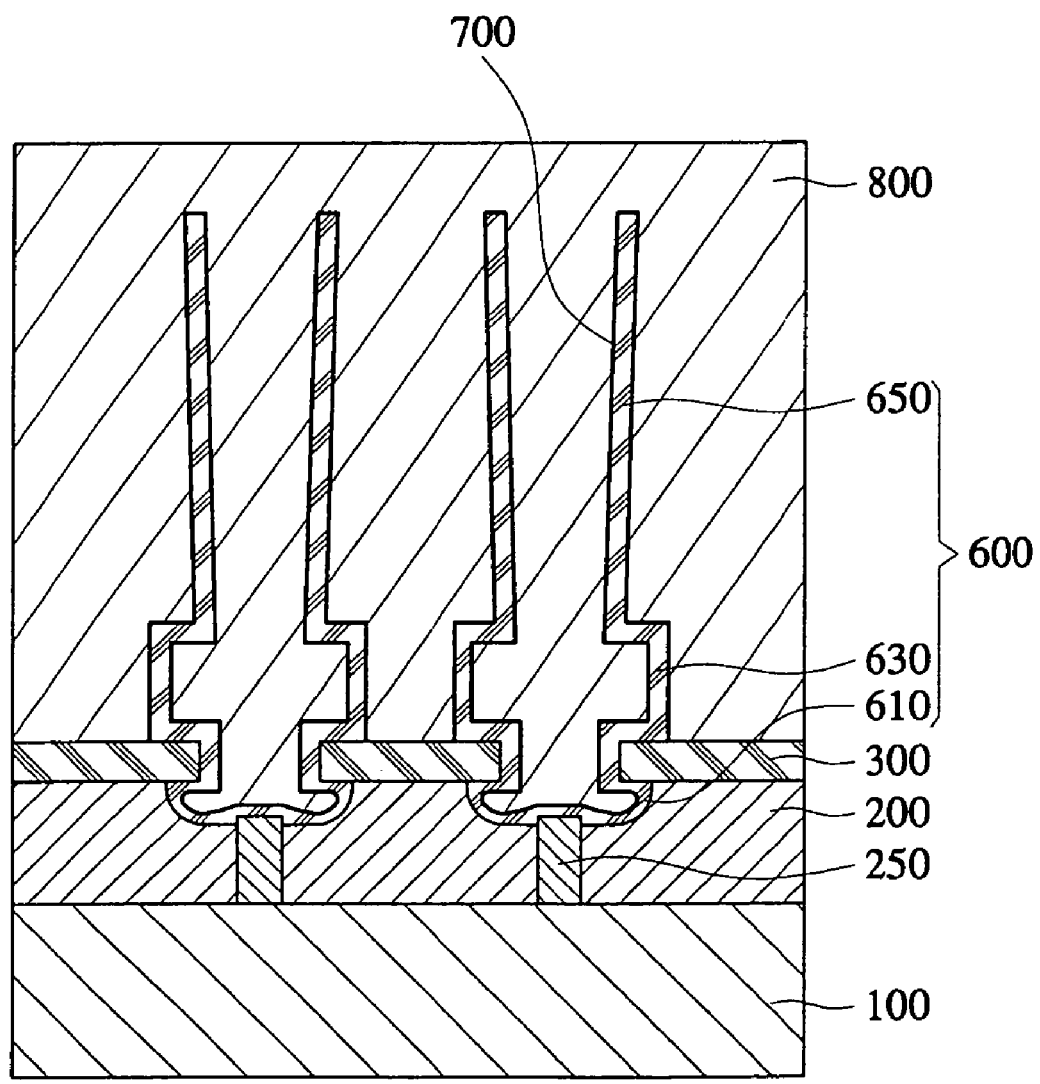

In another embodiment of the present invention, as shown in FIG. 2F, before the dielectric layer 700 is formed, the lower and upper sacrificial oxide layers 400 and 500 can be selectively removed to expose the outside walls of the cylinder type lower electrodes 600.

Figure 2G:
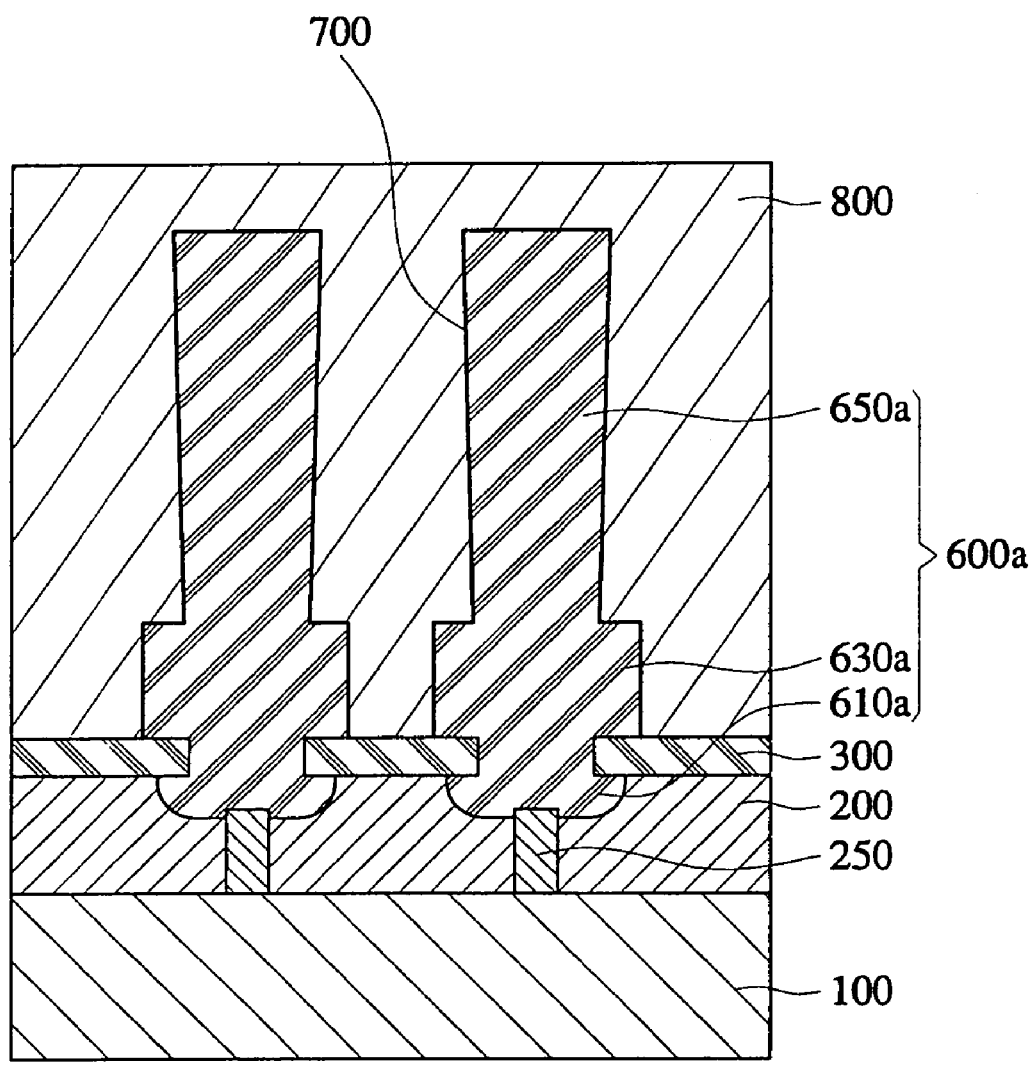

In yet another embodiment, as shown in FIG. 2G, a conductive layer which completely fills the cleaned capacitor holes 500 can be formed over the semiconductor substrate 100 having the cleaned capacitor holes 550. This conductive layer is then planarized until an upper portion of the upper sacrificial oxide layer 500 is exposed, thereby forming box type lower electrodes 600a. Each of the box type lower electrodes 600a includes a base portion 610a which fills a space below the etch stopping layer 300, an intermediate pole 630a filling a hole that penetrates the lower sacrificial oxide film 400, and a top pole 650a filling a hole that penetrates the upper sacrificial oxide layer 500. In the case of formation of the box type lower electrodes 600a, it is preferable that the lower and upper sacrificial oxide layers 400 and 500 be selectively removed to expose the outside walls of the box type lower electrodes 600a. Thereafter, a dielectric layer 700 and an upper electrode 800 are sequentially formed over the surface of the semiconductor substrate 100 having the box type lower electrodes 600a.

Further, a hemispherical grain silicon layer (not shown) can be additionally formed on the surface of the lower electrodes 600 or 610a.

As previously stated, the method of forming the capacitor according to the invention can prevent an electrical bridge between the adjacent lower electrodes while maximizing the surface area of the lower electrodes of the capacitor.

While the invention has been particularly shown and described with reference to described embodiments thereof, it will be understood by those skilled in the art that the foregoing and other changes in form and details may be made therein without departing from the spirit and scope of the invention.

The invention claimed is:

1. A method of forming a capacitor, the method comprising:
    forming an insulating layer over a semiconductor substrate;
    forming a contact plug in the insulating layer;
    sequentially forming an etch stopping layer, a lower sacrificial oxide layer, and an upper sacrificial oxide layer over a surface of the semiconductor substrate having the contact plug;
    patterning the lower and upper sacrificial oxide layers until a portion of the etch stopping layer over the contact plug is exposed to form a capacitor hole;
    isotropically etching the lower sacrificial oxide layer to form an expanded capacitor hole therein;
    etching the exposed portion of the etch stopping layer until an upper portion of the contact plug is exposed to form a final capacitor hole; and
    cleaning the semiconductor substrate having the final capacitor hole to remove a native oxide film on the exposed upper portion of the contact plug.

2. The method of claim 1, wherein the etch stopping layer is made of nitride.

3. The method of claim 1, wherein the lower sacrificial oxide layer has a faster isotropic etching rate than the upper sacrificial oxide layer.

4. The method of claim 1, wherein the lower sacrificial oxide layer comprises a layer selected from the group consisting of a borophosphorsilicate glass (BPSG) layer, a phasphorsilicate glass (PSG) layer and an undoped silicate glass (USG) layer.

5. The method of claim 1, wherein the upper sacrificial oxide layer is made of plasma enhanced tetra-ethyl-orthosilicate (PE-TEOS).

6. The method of claim 1, wherein the expanded capacitor hole is formed by wet-etching an exposed portion of the lower sacrificial oxide film in the capacitor hole.

7. The method of claim 6, wherein the wet-etching is performed using a hydrofluoric acid.

8. The method of claim 1, further comprising:
    forming a conductive layer over the surface of the semiconductor substrate having the cleaned, capacitor hole;
    selectively removing a portion of the conductive layer over the upper sacrificial oxide layer to form a lower electrode in the cleaned capacitor hole; and
    sequentially forming a dielectric layer and an upper electrode over a surface of the semiconductor substrate having the lower electrode.

9. The method of claim 8, wherein the conductive layer is conformally formed according to a step difference of the cleaned capacitor hole, and the lower electrode has a cylindrical shape in cross-section.

10. The method of claim 9, further comprising selectively removing the lower and upper sacrificial oxide layers to expose an outside wall of the lower electrode prior to formation of the dielectric layer and the upper electrode.

11. The method of claim 8, wherein the conductive layer is formed to fill the cleaned capacitor hole, and the lower electrode has a box shape in cross-section.

12. The method of claim 11, further comprising selectively removing the lower and upper sacrificial oxide layers to expose an outside wall of the lower electrode prior to formation of the dielectric layer and the upper electrode.

13. The method of claim 1, wherein cleaning the semiconductor substrate having the final capacitor hole is performed only to remove a native oxide film on the exposed upper portion of the contact plug so that cleaning process time can be reduced and the formation of an electrical bridge between the lower electrodes can be prevented.

14. The method of claim 1, wherein isotropically etching the lower sacrificial oxide layer is performed before etching the exposed portion of the etch stopping layer.

15. The method of claim 1, wherein etching the exposed portion of the etch stopping layer comprises exposing a portion of the insulating layer adjacent to the contact plug.

* * * * *

UNITED STATES PATENT AND TRADEMARK OFFICE
CERTIFICATE OF CORRECTION

| | |
|---|---|
| PATENT NO. | : 7,101,769 B2 |
| APPLICATION NO. | : 10/776546 |
| DATED | : September 5, 2006 |
| INVENTOR(S) | : Seung-Beom Kim et al. |

It is certified that error appears in the above-identified patent and that said Letters Patent is hereby corrected as shown below:

Column 6, line 3, the word "cleaned," should read -- cleaned --.

Signed and Sealed this

Twenty-eighth Day of July, 2009

JOHN DOLL
*Acting Director of the United States Patent and Trademark Office*